(12) United States Patent
Komatsu et al.

(10) Patent No.: US 11,742,829 B2
(45) Date of Patent: Aug. 29, 2023

(54) MULTIPLEXER WITH FILTER HAVING INCREASED REFLECTION CHARACTERISTIC

(71) Applicant: Skyworks Solutions, Inc., Irvine, CA (US)

(72) Inventors: Tomoya Komatsu, Irvine, CA (US); Yiliu Wang, Irvine, CA (US); Nan Wu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 205 days.

(21) Appl. No.: 17/002,456

(22) Filed: Aug. 25, 2020

(65) Prior Publication Data

US 2021/0067139 A1    Mar. 4, 2021

Related U.S. Application Data

(60) Provisional application No. 62/892,954, filed on Aug. 28, 2019.

(51) Int. Cl.
| | |
|---|---|
| *H03H 9/72* | (2006.01) |
| *H03H 9/02* | (2006.01) |
| *H03H 9/64* | (2006.01) |
| *H03H 9/25* | (2006.01) |
| *H04B 1/00* | (2006.01) |

(52) U.S. Cl.
CPC .......... *H03H 9/25* (2013.01); *H03H 9/02834* (2013.01); *H03H 9/6406* (2013.01); *H03H 9/6483* (2013.01); *H04B 1/0057* (2013.01)

(58) Field of Classification Search
CPC .. H03H 9/02; H03H 9/25; H03H 9/64; H03H 9/70
See application file for complete search history.

(56) References Cited

U.S. PATENT DOCUMENTS

| | | | |
|---|---|---|---|
| 9,136,458 B2 | 9/2015 | Komatsu et al. | |
| 9,473,107 B2 | 10/2016 | Komatsu et al. | |
| 9,748,924 B2 | 8/2017 | Komatsu et al. | |
| 9,780,866 B2* | 10/2017 | Khlat | H04B 7/24 |
| 9,917,603 B2* | 3/2018 | Araki | H04B 1/40 |
| 10,256,792 B2* | 4/2019 | Kim | H03H 9/547 |
| 10,298,274 B2 | 5/2019 | Takamine et al. | |
| 10,305,449 B2* | 5/2019 | Takamine | H03H 9/706 |
| 10,382,009 B2* | 8/2019 | Nosaka | H04B 1/00 |
| 10,804,882 B2* | 10/2020 | Matsubara | H03H 9/706 |
| 11,206,010 B2* | 12/2021 | Miyazaki | H04B 1/40 |
| 2014/0049341 A1 | 2/2014 | Komatsu et al. | |
| 2017/0244431 A1* | 8/2017 | Araki | H04J 1/045 |
| 2020/0014370 A1* | 1/2020 | Matsubara | H03H 9/6483 |

* cited by examiner

*Primary Examiner* — Hafizur Rahman
*Assistant Examiner* — Alan Wong
(74) *Attorney, Agent, or Firm* — Knobbe, Martens, Olson & Bear, LLP

(57) ABSTRACT

Aspects of this disclosure relate to a multiplexer that includes at least a first filter having a first passband and a second filter having a second passband. The first filter includes acoustic wave resonators coupled to a common node by a series inductor. The acoustic wave resonators start with a shunt acoustic resonator from the common node. The series inductor and the shunt acoustic resonator of the first filter are together arranged to increase a reflection coefficient of the first filter in the second passband.

18 Claims, 13 Drawing Sheets

MULTIPLEXER WITH FILTER HAVING INCREASED REFLECTION CHARACTERISTIC

CROSS REFERENCE TO PRIORITY APPLICATION

Any and all applications for which a foreign or domestic priority claim is identified in the Application Data Sheet as filed with the present application are hereby incorporated by reference under 37 CFR § 1.57. This application claims the benefit of priority of U.S. Provisional Patent Application No. 62/892,954, filed Aug. 28, 2019 and titled "MULTIPLEXER WITH FILTER HAVING INCREASED REFLECTION CHARACTERISTIC," the disclosure of which is hereby incorporated by reference in its entirety herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transducer electrode is disposed. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer.

In multiplexers, an acoustic wave filter can experience insertion loss due to loading from one or more other filters of the multiplexer. It is also generally desirable for the acoustic wave filter to have a high reflection coefficient in a passband of one or more other filters of the multiplexer. Achieving low insertion loss for the acoustic wave filter and high reflection coefficient for the acoustic wave filter in passbands of other filters of the multiplexer can be challenging.

SUMMARY

The innovations described in the claims each have several aspects, no single one of which is solely responsible for its desirable attributes. Without limiting the scope of the claims, some prominent features of this disclosure will now be briefly described.

One aspect of this disclosure is a multiplexer for filtering radio frequency signals. The multiplexer includes a first filter and a second filter. The first filter has a first passband that is a lowest passband of all filters of the multiplexer. The first filter includes a series inductor and a plurality of acoustic resonators coupled to a common node by way of the series inductor. The plurality of acoustic resonators starts with a shunt acoustic resonator from the common node. The second filter is coupled to the common node and has a second passband that is above the first passband. The series inductor and the shunt acoustic resonator of the first filter are together arranged to increase a reflection coefficient of the first filter in the second passband.

The multiplexer can further include a third filter having a third passband and coupled to the common node, in which the third passband is above both the first and second passbands. The series inductor and the shunt acoustic resonator can together be arranged to increase the reflection coefficient of the first filter in the third passband.

The plurality of acoustic resonators can include a first ladder stage from the common node, in which the first ladder stage starts with the shunt acoustic resonator.

All filters of the multiplexer can be arranged as receive filters.

The first filter can be a transmit filter. The second filter can be a second transmit filter.

The second filter can include a front end series resonator and all other acoustic resonators of the second filter can be coupled to the common node via the front end series resonator.

The first filter can be coupled to the common node without an intervening switch.

The series inductor can be a surface mount inductor.

The multiplexer can further include a third filter coupled to the common node via a switch, in which the third filter has a third passband above both the first passband and the second passband.

The multiplexer can further include a third filter having a third passband that is below the second passband and that is above the first passband. The third filter can include a second series inductor and a second plurality of acoustic resonators coupled to the common node by way of the second series inductor. The second plurality of acoustic resonators can start with a first shunt acoustic resonator from the common node. The second plurality of acoustic resonators can include ladder stage closest to the common node that starts with the first shunt acoustic resonator.

The plurality of acoustic resonators includes a surface acoustic wave resonator. The plurality of acoustic resonators includes a temperature compensated surface acoustic wave resonator. The plurality of acoustic resonators can include a bulk acoustic wave resonator. The plurality of acoustic resonators can include a multi-mode surface acoustic wave filter.

Another aspect of this disclosure is a multiplexer for filtering radio frequency signals. The multiplexer includes a first filter and a second filter. The first filter has a first passband. The first filter includes a series inductor and a plurality of acoustic resonators coupled to a common node by way of the series inductor. The plurality of acoustic resonators starts with a shunt acoustic resonator from the common node. The second filter is coupled to the common node and has a second passband that is above the first passband. The series inductor and the shunt acoustic resonator of the first filter are together arranged to increase a reflection coefficient of the first filter in the second passband. All filters of the multiplexer are arranged as receive filters.

The first passband can be a lowest passband of all filters of the multiplexer.

The multiplexer can further include a third filter having a third passband and coupled to the common node, in which the third passband is above both the first and second passbands. The series inductor and the shunt acoustic resonator can together be arranged to increase the reflection coefficient of the first filter in the third passband.

The plurality of acoustic resonators can include a first ladder stage from the common node, and the first ladder stage can start with the shunt acoustic resonator.

The second filter can include a front end series resonator and all other acoustic resonators of the second filter can be coupled to the common node via the front end series resonator. The front end series resonator can have a smaller capacitance than at least one of the other acoustic resonators of the second filter. The front end series resonator can have a smaller capacitance than each of the other acoustic resonators of the second filter.

The first filter can be coupled to the common node without an intervening switch.

The series inductor can be a surface mount inductor.

The multiplexer can further include a third filter coupled to the common node via a switch, in which the third filter has a third passband above both the first passband and the second passband.

The multiplexer can further include a third filter that includes a third passband that is below the second passband and that is above the first passband, in which the third filter includes a second series inductor and a second plurality of acoustic resonators coupled to the common node by way of the second series inductor, and in which the second plurality of acoustic resonators includes a ladder stage closest to the common node that starts with a first shunt acoustic resonator.

The plurality of acoustic resonators can include a surface acoustic wave resonator. The plurality of acoustic resonators can include a temperature compensated surface acoustic wave resonator. The plurality of acoustic resonators can include a bulk acoustic wave resonator. The plurality of acoustic resonators can include a multi-mode surface acoustic wave filter.

Another aspect of this disclosure is a radio frequency module that includes a multiplexer in accordance with any suitable principles and advantages disclosed herein and a radio frequency circuit element coupled to the multiplexer. The multiplexer and the radio frequency circuit element are enclosed within a common package.

The radio frequency circuit element can be a radio frequency amplifier arranged to amplify a radio frequency signal. The radio frequency amplifier can be a low noise amplifier. The radio frequency module can further include a second low noise amplifier coupled to the multiplexer. The radio frequency amplifier can be a power amplifier. The radio frequency module can further include a switch configured to selectively couple the multiplexer to an antenna port of the radio frequency module.

The radio frequency circuit element can be a switch configured to selectively couple the multiplexer to an antenna port of the radio frequency module.

Another aspect of this disclosure is a wireless communication device that includes a multiplexer in accordance with any suitable principles and advantages disclosed herein, an antenna operatively coupled to the common node of the multiplexer, a radio frequency amplifier operatively coupled to the multiplexer and configured to amplify a radio frequency signal, and a transceiver in communication with the radio frequency amplifier.

The wireless communication device can further include a baseband processor in communication with the transceiver.

The multiplexer can be included in a radio frequency front end. The multiplexer can be included in a diversity receive module.

Another aspect of this disclosure is a method of filtering a radio frequency signal. The method includes receiving a radio frequency signal at a port of a first filter of a multiplexer in accordance with any suitable principles and advantages disclosed herein, and filtering the radio frequency signal with the first filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
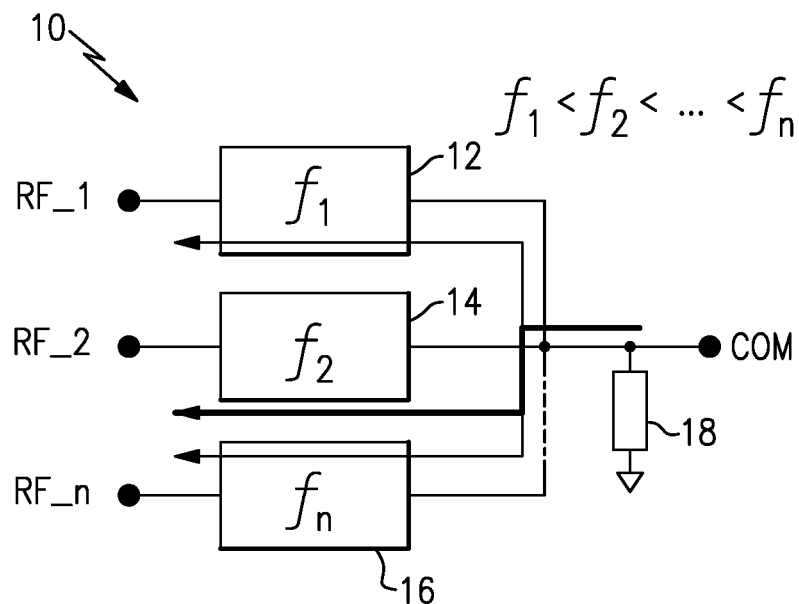
FIG. 1 is a schematic diagram of a multiplexer.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

An acoustic wave filter in a multiplexer can experience insertion loss due to signal leakage into one or more other filters of the multiplexer. At the same time, it can be desirable for the acoustic wave filter to have a high reflection coefficient in a passband of other filter(s) of the multiplexer.

An acoustic wave filter of a multiplexer can be arranged to provide an "open" impedance for pass bands of other filters of the multiplexer to reduce and/or minimize loading loss. However, some technical solutions to reducing loading loss can result in degraded reflection coefficient (gamma) at higher frequencies.

Aspects of this disclosure relate to an acoustic wave filter of a multiplexer that can achieve relatively low insertion loss in a passband and relatively high gamma at relatively high frequencies. The acoustic wave filter includes acoustic resonators and a series inductor coupled between the acoustic resonators and a common node of the multiplexer, in which a shunt resonator of the acoustic resonators is coupled to a node between the other acoustic resonators and the series inductor. A topology of the acoustic wave filter includes a series inductor and a shunt acoustic resonator closest to the common node. For example, in the acoustic filter, the first ladder stage of the acoustic resonators from the common node starts with the shunt acoustic resonator. The acoustic wave filter can have the lowest passband of the plurality of filters of the multiplexer.

FIG. 1 is a schematic diagram of a multiplexer 10. The multiplexer 10 includes a plurality of filters coupled to a common node COM. As illustrated, the multiplexer 10 includes a first filter 12, a second filter 14, and an N-th filter 16 coupled to each other at the common node COM. The multiplexer 10 can include any suitable number of filters that is three or greater. The illustrated multiplexer 10 includes a shunt inductor 18 coupled to the common node COM.

The first filter 12, the second filter 14, and the third filter 16 can each be band pass filters with respective passbands. The first filter 12 has a first passband f1 that is below a second passband f2 of the second filter 14. The second pass band f2 of the second filter 14 is below the N-th passband fn. In the multiplexer 10, the first filter 12 is coupled between the common node COM and a first input/output node RF_1. The second filter 14 is coupled between the common node COM and a second input/output node RF_2. The N-th filter 16 is coupled between the common node COM and an N-th input/output node RF_N. The multiplexer 10 can include any suitable number N of filters in which N is an integer 3 or greater.

In certain applications, the first filter 12, the second filter 14, and the N-th filter 16 can all be receive filters. Such applications can include diversity receive applications. When the illustrated filters are each receive filters, the input/output ports RF_1, RF_2, and RF_N can be output ports and the common node COM can serve as an input port. According to some other applications, the first filter 12, the second filter 14, and the N-th filter 16 can all be transmit filters. When the illustrated filters are each transmit filters, the input/output ports RF_1, RF_2, and RF_N can be input ports and the common node COM can serve as an output port. The first filter 12, the second filter 14, and the N-th filter 16 can include any suitable combination of one or more transmit filters and/or one or more receive filters. The multiplexer 10 can be implemented in carrier aggregation applications.

Insertion loss of an individual filter of the multiplexer 10 can be degraded compared to the individual filter being implemented as a standalone filter. This can be due to signal leakage from one or more other filters of the multiplexer.

Figure 2:
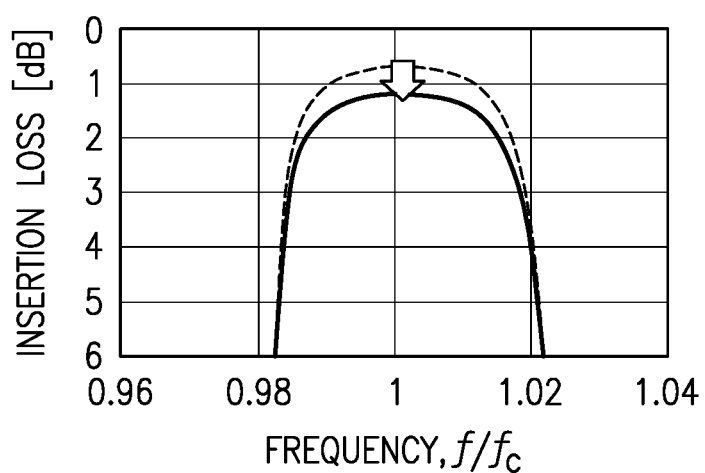
FIG. 2 is a graph comparing insertion loss of a standalone filter with insertion loss of the same filter in a multiplexer with loading loss.

FIG. 2 is a graph comparing insertion loss of a standalone filter with insertion loss of the same filter in a multiplexer with loading loss. In particular, this graph corresponds to the second filter 14 of the multiplexer 10 of FIG. 1. As shown by relatively thin lines with arrows in FIG. 1, there can be signal leakage of a radio frequency (RF) signal being filtered by the second filter 14 into the first filter 12 and the N-th filter 16 of the multiplexer 10 of FIG. 1. The graph of FIG. 2 shows that this can cause insertion loss to be degraded in the passband of the second filter 14 of the multiplexer 10 compared to the passband of a standalone implementation of the second filter 14.

Figure 3:
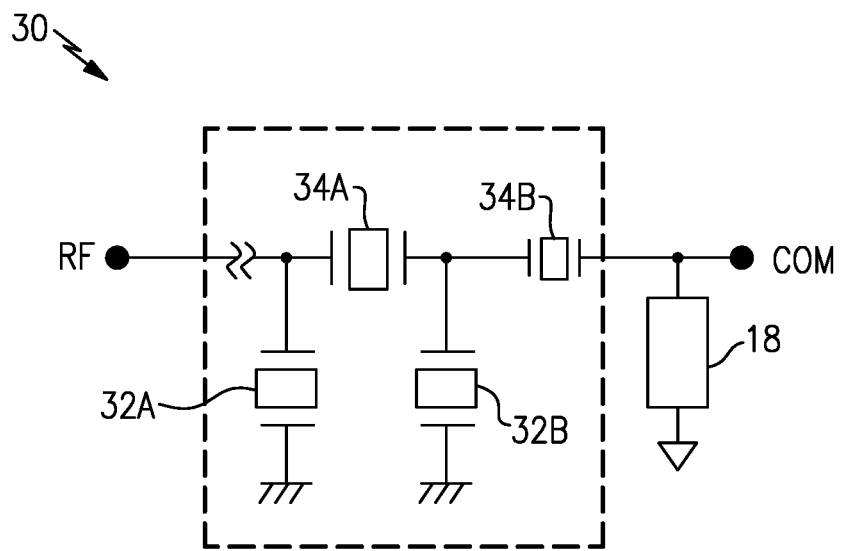
FIG. 3 is a schematic diagram of an acoustic wave filter with relatively low insertion loss.

FIG. 3 is a schematic diagram of an acoustic wave filter 30 with relatively low insertion loss. The acoustic wave filter 30 includes a plurality of shunt acoustic resonators 32A and 32B and a plurality of series acoustic resonators 34A and 34B together arranged to filter a radio frequency signal. The all other acoustic resonators of the acoustic wave filter 30 are coupled to the common node COM of a multiplexer via the series acoustic resonator 34B. The series acoustic resonator 34B can be referred to as a front end series resonator. In FIG. 3, the illustrated shunt inductor 18 electrically connected to each filter of a multiplexer at the common node COM.

The series acoustic resonator 34B can be arranged to have a higher impedance than other acoustic resonators of the acoustic wave filter 30. For instance, the series acoustic resonator 34B can have a smaller capacitance than other acoustic resonators of the acoustic wave filter 34B. In FIG. 3, the series acoustic resonator 34B is shown as being smaller than the series acoustic resonator 34A to indicate a smaller resonator capacitance. With the relatively high impedance of the series acoustic resonator 34B, the acoustic wave filter 30 can have an impedance that is can be "open" at passbands of other filters of a multiplexer that includes the acoustic wave filter 30. This can reduce and/or minimize loading loss. In the acoustic wave filter 30, the first ladder stage from the common node COM starts with the series acoustic resonator 34B.

Although two series acoustic resonators and two shunt acoustic resonators are illustrated in FIG. 3, any suitable number of series acoustic resonators and any suitable number of shunt acoustic resonators can be included in an acoustic wave filter in accordance with any suitable principles and advantages of the acoustic wave filter 30.

Figure 4:
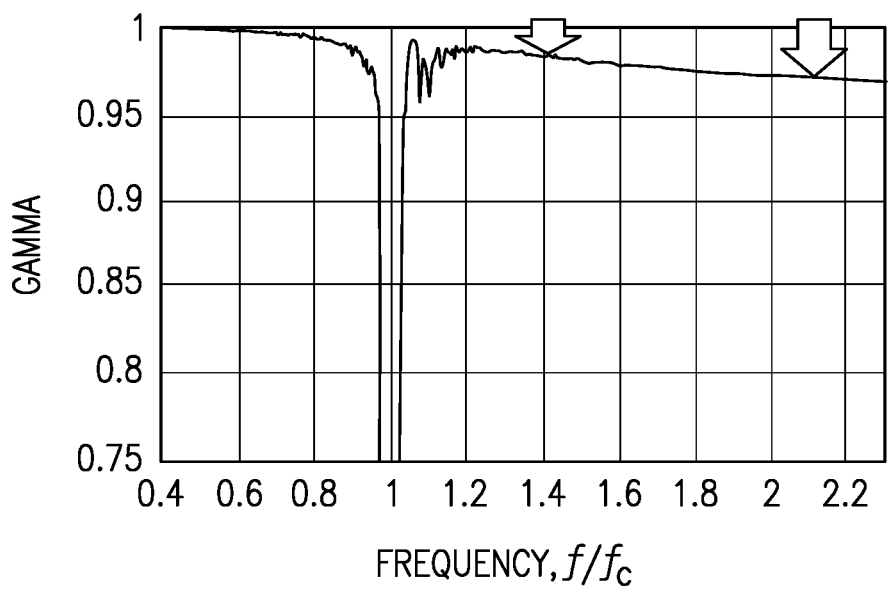
FIG. 4 is a graph of a reflection coefficient over frequency for the filter of FIG. 3.

FIG. 4 is a graph of a reflection coefficient over frequency for the filter 30 of FIG. 3. Even if the front end series resonator 34B of the acoustic wave filter 30 of FIG. 3 has a relatively small capacitance, the impedance of the front end series resonator 34B can become lower with increasing frequency. The impedance of the front end resonator 34B can be represented by Equation 1.

$$X = \frac{-1}{wC} \qquad \text{(Eq. 1)}$$

In Equation 1, X is impedance, C is capacitance, and w is frequency. As frequency w increases, the impedance X of the front end resonator 34B can decrease. This can result in a reduced reflection coefficient (gamma) of the acoustic wave filter 30 at higher frequencies.

The graph in FIG. 4 illustrates the reflection coefficient of the acoustic wave filter 30 degrading at higher frequencies. For example, the reflection coefficient is degraded above about 1.4 f/fc, where f is frequency and fc is the center frequency of the passband of the filter. This can be undesirable when the reflection coefficient is degraded in a passband of one or more other filters of a multiplexer that includes the acoustic wave filter 30.

Figure 5:
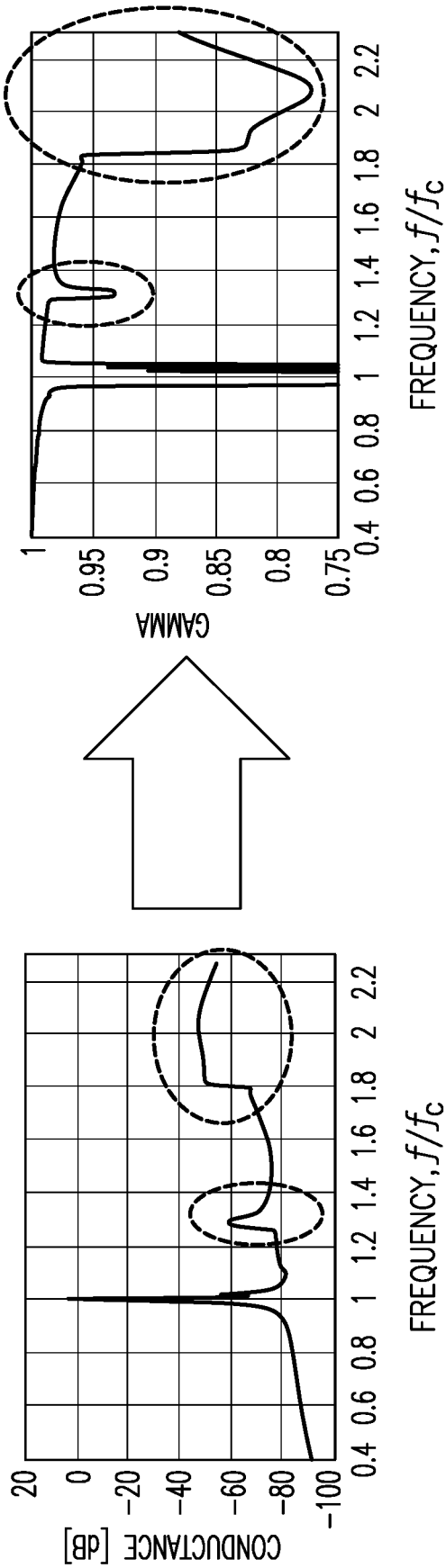
FIG. 5A is a graph of conductance over frequency illustrating a bulk mode impact for a surface acoustic wave filter with a topology illustrated in FIG. 3.
FIG. 5B is a graph of reflection coefficient over frequency illustrating a bulk mode impact for a surface acoustic wave filter with a topology illustrated in FIG. 3.

FIG. 5A is a graph of conductance over frequency illustrating a bulk mode impact for a surface acoustic wave filter with a topology illustrated in FIG. 3. The graph in FIG. 3 corresponds to a simulation with the acoustic wave filter 30 including temperature compensated surface acoustic wave resonators with a lithium niobate piezoelectric substrate having a 128° cut angle. Such surface acoustic wave resonators can have multiple modes at relatively high frequencies (e.g., shear wave mode, longitudinal wave mode, reflections from back side of piezoelectric substrate, etc.). The graph in FIG. 5A shows that bulk modes for surface acoustic wave resonators can impact conductance at frequencies above the passband of the acoustic wave filter 30. The conductance is increased around 1.25 f/fs to 1.3 f/fs and from around 1.8 f/fs to 2.2 f/fs in FIG. 5A.

FIG. 5B is a graph of reflection coefficient over frequency illustrating a bulk mode impact for a surface acoustic wave filter with a topology illustrated in FIG. 3. FIG. 5B corresponds to acoustic wave filter 30 simulated in FIG. 5A. This graph shows that the reflection coefficient (gamma) is significantly decreased at certain frequencies above the passband of the acoustic wave filter 30. The reflection coefficient is significantly decreased at frequencies at which the conductance is increased in FIG. 5A. Such a decrease can be due to bulk mode impact of surface acoustic wave resonators.

Figure 6:
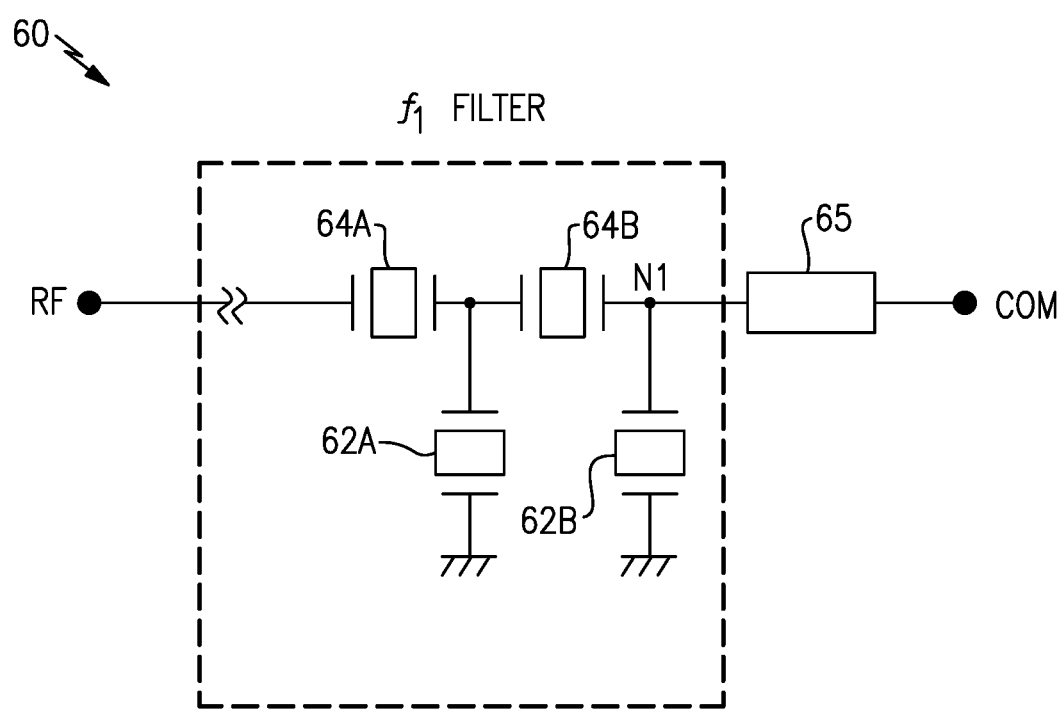
FIG. 6 is a schematic diagram of an acoustic wave filter according to an embodiment.

FIG. 6 is a schematic diagram of a filter 60 according to an embodiment. The filter 60 includes a plurality of acoustic resonators 62A, 62B, 64A, and 64B and a series inductor 65. The filter 60 is coupled between an input/output node RF and a common node COM of a multiplexer. The series inductor 65 is arranged in series between all acoustic resonators of the filter 60 and the common node COM. The acoustic resonators of the filter 60 include a shunt acoustic resonator 62B coupled to a node N1 between all other acoustic resonators of the acoustic wave filter and the common node COM. The acoustic resonators of the filter 60 start with the shunt acoustic resonator 62B from the common node COM. The first ladder stage of the acoustic wave resonators of the filter 60 from the common node COM starts with the shunt acoustic resonator 62B.

An impedance of the series inductor 65 can be represented by Equation 2.

$$X = wL \qquad \text{(Eq. 2)}$$

In Equation 2, X is impedance, L is inductance, and w is frequency. As frequency w increases, the impedance X of the series inductor 65 can increase. This can result in an increased reflection coefficient of the filter 60 at higher frequencies.

The acoustic resonators of the filter 60 can include any suitable acoustic resonators, such as one or more bulk acoustic wave resonators (e.g., one or more film bulk acoustic wave resonators and/or one or more solidly mounted resonators), one or more surface acoustic wave resonators (e.g., one or more temperature compensated surface acoustic wave resonators and/or one or more non-temperature compensated surface acoustic wave resonators and/or one or more multi-layer piezoelectric substrate surface acoustic wave resonators), one or more Lamb wave resonators, one or more boundary wave resonators, the like, or any suitable combination thereof. For example, in certain instances the plurality of acoustic resonators of the filter 60 are temperature compensated surface acoustic wave resonators.

Although two shunt acoustic resonators 64A and 64B and two series acoustic resonators 62A and 62B are illustrated in FIG. 6, any suitable number of series acoustic resonators and any suitable number of shunt acoustic resonators can be included in an acoustic wave filter in accordance with any suitable principles and advantages of the filter 60.

Figure 7:
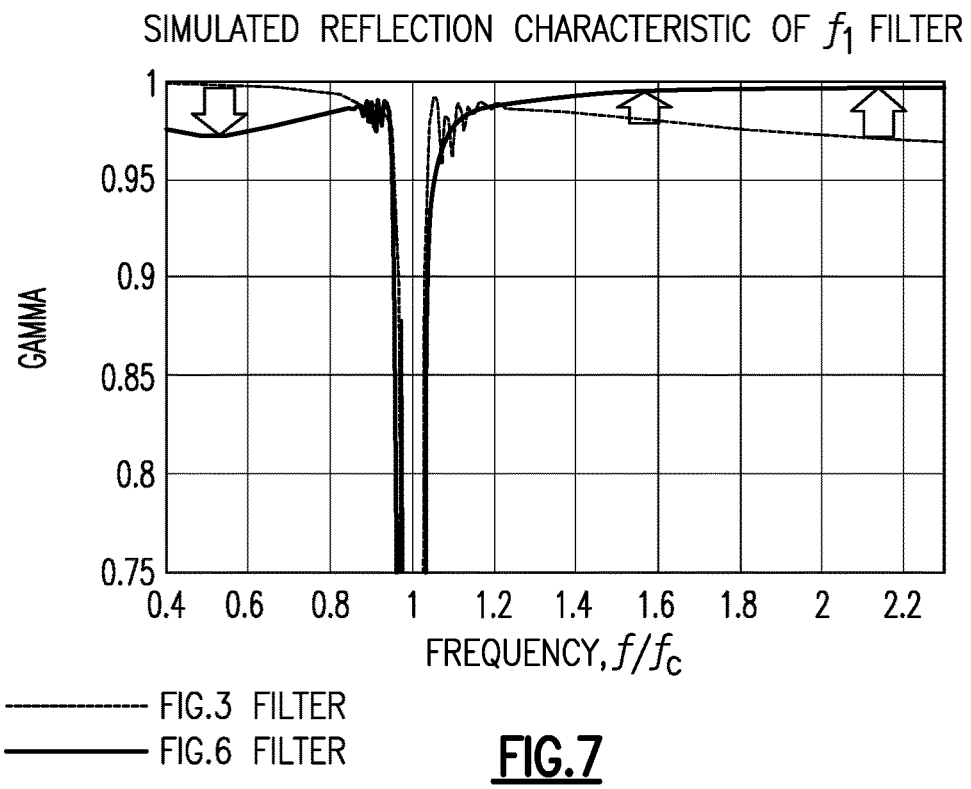
FIG. 7 is a graph of simulated reflection coefficient for the acoustic wave filter of FIG. 6 compared to the simulated reflection coefficient for the acoustic wave filter of FIG. 3.

FIG. 7 is a graph of simulated reflection coefficient for the filter 60 of FIG. 6 compared to the acoustic wave filter 30 of FIG. 3. As shown in FIG. 7, the reflection coefficient of the filter 60 increases at higher frequencies relative to the acoustic wave filter 30 of FIG. 3. The reflection coefficient below the passband of the filter 60 can be degraded relative to the acoustic wave filter 30. This can be due to a LC resonance of the series inductor 65 and the shunt acoustic resonator 64B of the filter 60. Accordingly, the topology of the filter 60 can be used for a filter having a lowest passband of a multiplexer in certain applications. The topology of the filter 60 can alternatively or additionally be used for a second filter of a multiplexer that has a passband that is relatively close in frequency to a first filter with a lower passband such that the reflection coefficient for the second filter in the passband of the first filter is not significantly degraded. The topology of the acoustic wave filter 30 can be used for one or more filters of a multiplexer that have a passband above a passband of one or more other filters. The reflection coefficient of the acoustic wave filter 30 is relatively high below its passband and thus can be relatively high in passbands of one or more other filters with a lower passband.

Figure 8:
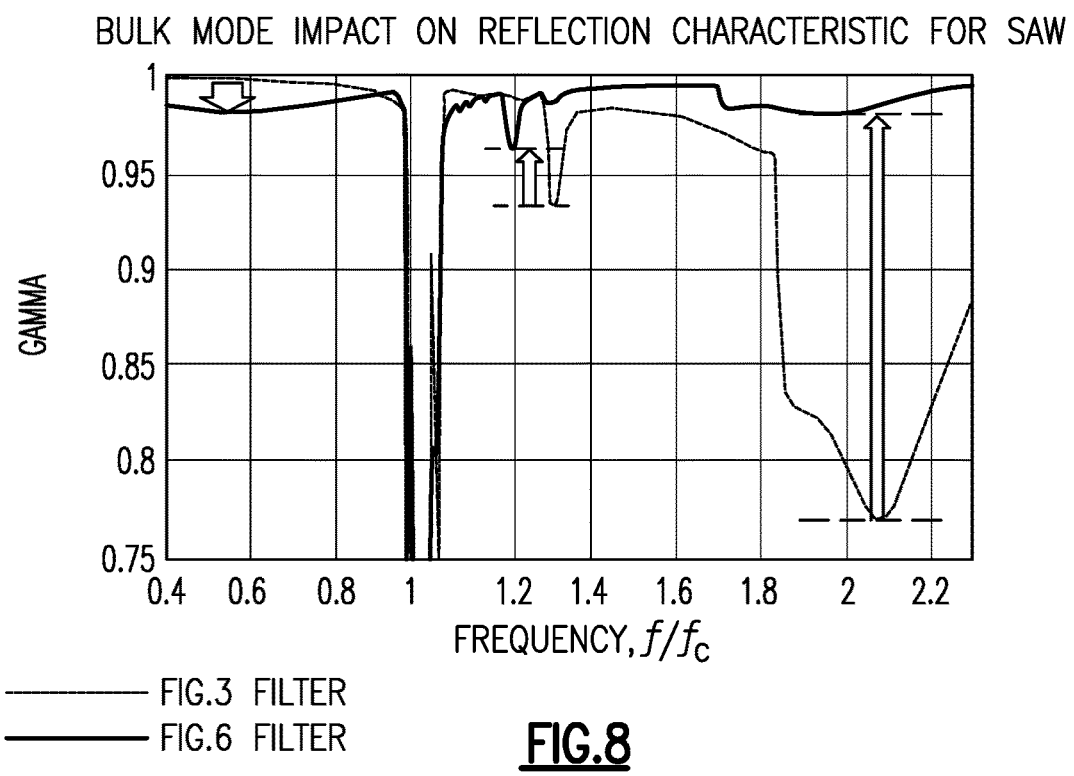
FIG. 8 is a graph of simulated reflection coefficient illustrating a bulk mode impact for a surface acoustic wave filter with a topology illustrated in FIG. 6 compared to a surface acoustic wave filter with a topology illustrated in FIG. 3.

FIG. 8 is a graph of simulated reflection coefficient illustrating a bulk mode impact for a surface acoustic wave filter with a topology illustrated in FIG. 6 compared to a surface acoustic wave filter with a topology illustrated in FIG. 3. A filter with surface acoustic wave resonators can experience bulk modes above the passband. These bulk modes can degrade reflection coefficient in certain frequency ranges above the passband of the filter. FIG. 8 indicates that the filter 60 can experience significantly less reflection coefficient degradation due to bulk modes above the passband than the acoustic wave filter 30.

Figure 9:
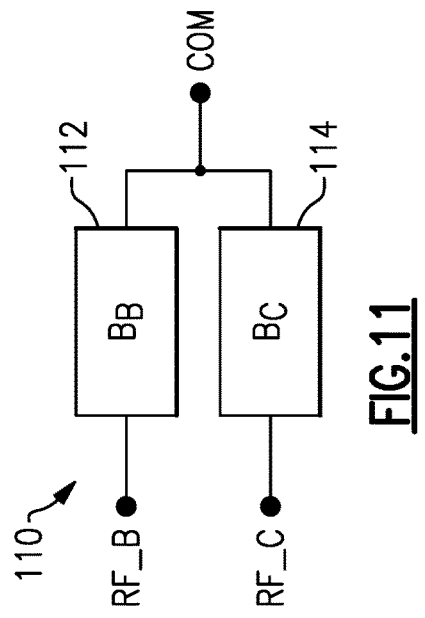
FIG. 9 is a schematic diagram of a filter according to an embodiment.

FIG. 9 is a schematic diagram of a filter 90 according to an embodiment. The filter 90 can implement a filter of a multiplexer with a lowest passband that is below the passbands of other filter(s) of the multiplexer. The filter 90 is coupled between an input/output node RF_A and a common node COM of the multiplexer. The filter 90 includes a plurality of acoustic resonators that include a shunt acoustic resonator 92 and other acoustic resonators 94. The filter 90 also includes a series inductor 95 arranged in series between the plurality of acoustic resonators and the common node COM.

The plurality of acoustic resonators of the filter 90 includes the shunt acoustic resonator 92 coupled to a node N1 between the other acoustic resonators 94 and the series inductor 95. The plurality of acoustic resonators of the filter 90 starts with the shunt acoustic resonator 92 from the common node. The first ladder stage of acoustic resonators from the common node COM can start with the shunt acoustic resonator 92 in the filter 90. The other acoustic resonators 94 can include any suitable number of series acoustic resonators and shunt acoustic resonators. The other acoustic resonators 94 can be arranged in any suitable topology, such as a ladder topology, a lattice topology, a combined lattice and ladder topology, or the like. The other acoustic resonators 94 can include one or more multi-mode surface acoustic wave (MMS) filters in certain applications. As one example an MMS filter can include a double-mode surface acoustic wave (DMS) filter. The other acoustic resonators 94 can include a combined ladder and MMS filter in some applications. According to an embodiment, the other acoustic resonators 94 can consist of an MMS filter. The filter 60 of FIG. 6 is an example of the filter 90 that includes a ladder filter topology.

The plurality of acoustic resonators of the filter 90 can include any suitable acoustic resonators, such as one or more bulk acoustic wave resonators (e.g., one or more film bulk acoustic wave resonators and/or one or more solidly mounted resonators), one or more surface acoustic wave resonators (e.g., one or more temperature compensated surface acoustic wave resonators and/or one or more non-temperature compensated surface acoustic wave resonators and/or one or more multi-layer piezoelectric substrate surface acoustic wave resonators), one or more Lamb wave resonators, one or more boundary wave resonators, the like, or any suitable combination thereof. For example, in certain instances, the plurality of acoustic resonators of the filter 90 are temperature compensated surface acoustic wave resonators.

The series inductor 95 can be implemented by any inductor suitable for a particular application. For example, the series inductor 95 can be a surface mount inductor in instances in which a relatively large inductance is desired. The series inductor 95 can be a conductive trace in a multi-chip module for relatively smaller inductances, for example, in instances where the passband is around 5 GHz. In some other instances, the series inductor 95 can be an integrated passive device (IPD) inductor implemented on an IPD die.

The series inductor 95 and the shunt acoustic wave resonator 92 can together function similarly to a low pass filter between the common node COM and the other acoustic resonators 94. The topology of the filter 90 with the series inductor 95 and the shunt acoustic wave resonator 92 can increase gamma at certain frequencies above the passband of the filter 90. The topology with the series inductor 95 and the shunt acoustic wave resonator 92 can mitigate bulk mode gamma degradation in instances in which the filter 90 includes surface acoustic wave resonators. The filter 90 and other filters of a multiplexer can together be arranged so as to compensate for each filter impedance at the common node COM.

Figure 10:
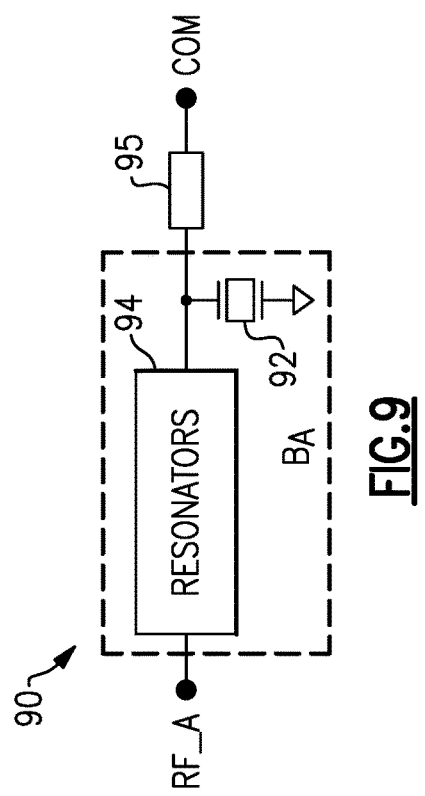
FIG. 10 is a Smith chart for the filter of FIG. 9.

FIG. 10 is a Smith chart for the filter 90 of FIG. 9. This Smith chart illustrates that the impedance of the filter 90 at the common node COM is inductive in a passband $B_A$ of the filter 90 and also inductive in passbands $B_B$ and $B_C$ of two other filters of a multiplexer that includes the filter 90. The two other filters of the multiplexer can implement the diplexer of FIG. 11.

Figure 11:
FIG. 11 is a schematic diagram of a diplexer.

FIG. 11 is a schematic diagram of a diplexer 110. The diplexer includes filters 112 and 114 coupled to each other at a common node COM. The filter 112 is coupled between an input/output node RF_B and the common node COM. The filter 114 is coupled between an input/output node RF_C and the common node COM. The passband $B_B$ of the filter 112 is below the passband $B_C$ of the filter 114 and above the passband of the filter 90 of FIG. 9.

Figure 12:
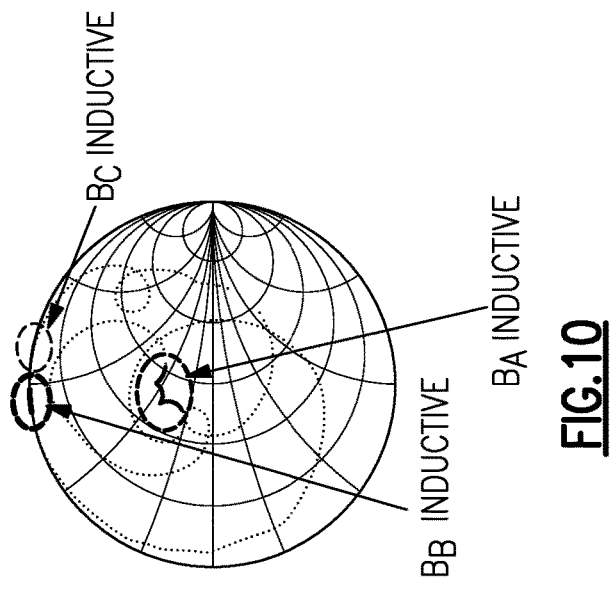
FIG. 12 is a Smith chart for the diplexer of FIG. 11.

FIG. 12 is a Smith chart for the diplexer 110 of FIG. 11. This Smith chart illustrates that the impedance of the diplexer 110 at the common node COM is capacitive in respective passbands $B_B$ and $B_C$ of the filters 112 and 114 and also capacitive in the passband $B_A$ of the filter 90 of FIG. 9.

Figure 13:
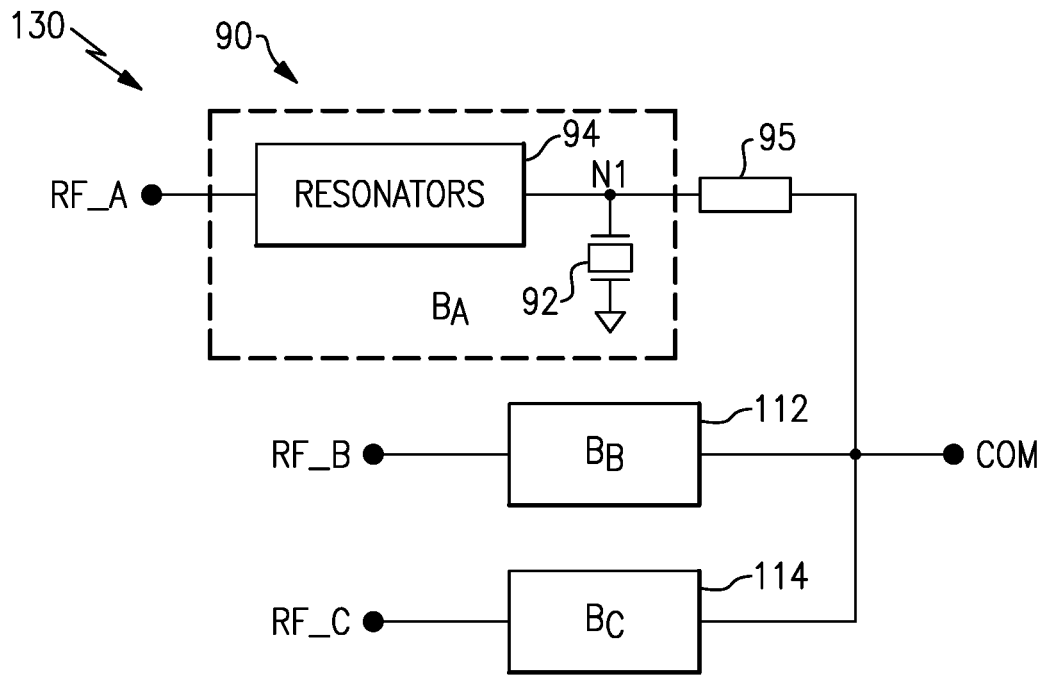
FIG. 13 is a schematic diagram of a multiplexer that includes the filter of FIG. 9 and the filters of the diplexer of FIG. 11 according to an embodiment.

FIG. 13 is a schematic diagram of a multiplexer 130 that includes the filter 90 of FIG. 9 and the filters of the diplexer 110 of FIG. 11 according to an embodiment. The multiplexer 130 shown in FIG. 13 is a triplexer. In the multiplexer 130, the filters 90, 112, and 114 are hard multiplexed with fixed connections to the common node COM. Each of the filters 90, 112, and 114 are electrically connected to the common node COM without an intervening switch in the multiplexer 130. The filters 90, 112, and 114 can have impedances that are arranged to compensate for each other at the common node COM. The filter 90 has a first passband $B_A$ that is lower than a second passband $B_B$ of the filter 112. The second passband $B_B$ of the filter 112 is lower than a third passband $B_C$ of the filter 114. The filters 90, 112, and 114 can all be receive filters in some instances, such as in diversity receive applications.

The shunt resonator 92 and the series inductor 95 of the filter 90 are arranged to increase gamma above the first passband $B_A$ such that gamma is increased in both the second passband $B_B$ of the filter 112 and the third passband $B_C$ of the filter 114. At the same time, the shunt resonator 92 and the series inductor 95 can contribute to low insertion loss for the filter 90 within the first passband $B_A$. The shunt resonator 92 and the series inductor 95 can degrade gamma below the first passband $B_A$. This gamma degradation is outside of the passbands of all filters of the multiplexer 130. Accordingly, this gamma degradation should not undesirably impact performance of the multiplexer 130.

Although not shown in FIG. 13, the multiplexer 130 and/or any other multiplexer disclosed herein can include a shunt inductor coupled to the common node COM, for example, like shown in FIG. 1. Accordingly, the series inductor 95 can be coupled between such a shunt inductor and all of the acoustic resonators of the filter 90.

The filter 114 can have the topology of the acoustic wave filter 30 of FIG. 3 in certain instances. Such a filter can achieve relatively low insertion loss. The filter 112 can have the topology of the acoustic wave filter of FIG. 3 is some instances. For instance, the filter 112 can be implemented by the acoustic wave filter 30 in applications where gamma degradation above the second passband $B_B$ of the filter 112 does not fall within a passband of another filter of the multiplexer that includes the filter 112. As one example, the filter 112 can be implemented by the acoustic wave filter 30 in applications where the third passband $B_C$ of the filter 114 is sufficiently close to the second passband $B_B$ of the filter 122 such that gamma degradation for filter 112 above the second passband $B_B$ is not significant in the third passband $B_C$. In some other instances, the filter 112 and/or the filter 114 can have any suitable topology.

Figure 14:
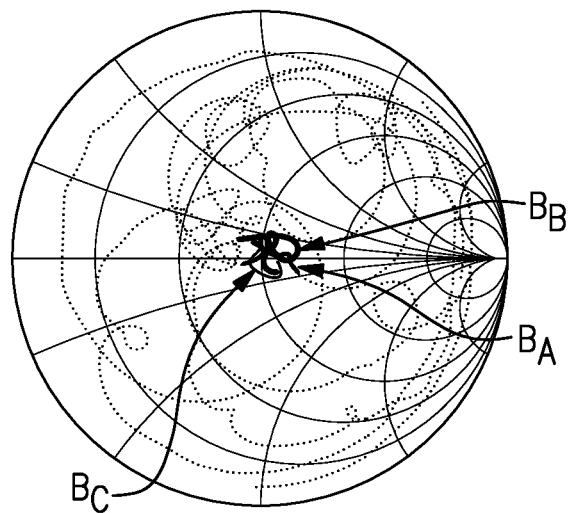
FIG. 14 is a Smith chart for the multiplexer of FIG. 13.

FIG. 14 is a Smith chart for the multiplexer 130 of FIG. 13. This Smith chart illustrates that impedance of the multiplexer 130 at the common node COM in respective passbands $B_A$, $B_B$, and $B_C$ of each filter 90, 112, and 114 is relatively close to 50 Ohms. This can be due to the combination of inductive and capacitive impedances of filter 90 and the filters of the diplexer 110. The Smith chart shown in FIG. 14 corresponds to the combination of the Smith charts of FIGS. 10 and 12.

Figure 15B:
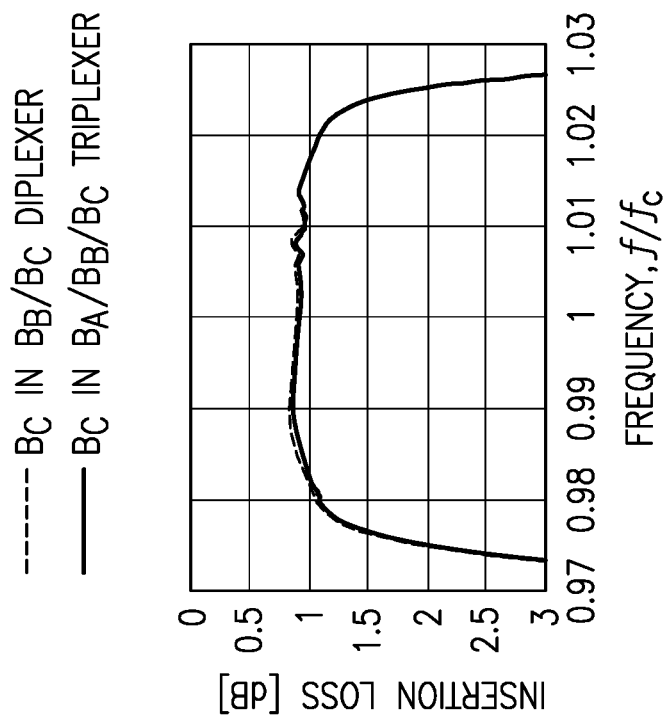
FIG. 15B is a graph that compares insertion loss for a second filter of the diplexer of FIG. 11 and the same filter in the multiplexer of FIG. 13.
Figure 15A:
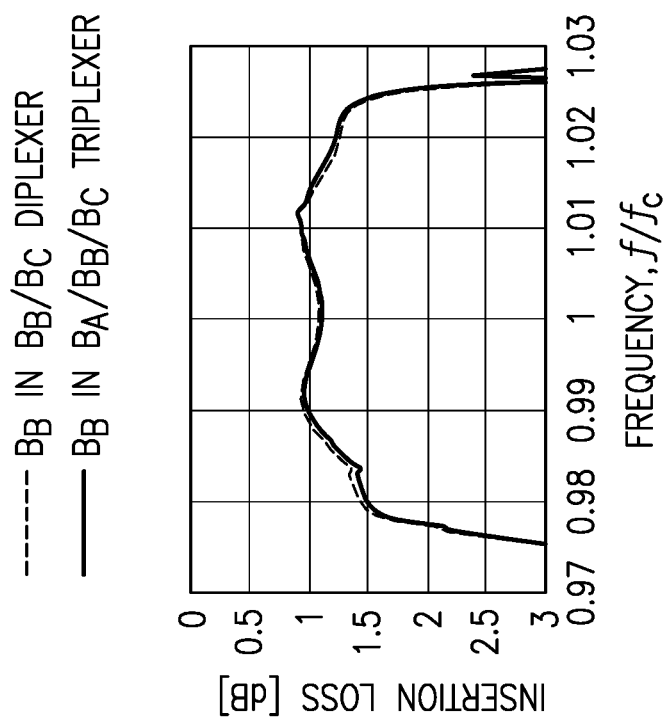
FIG. 15A is a graph that compares insertion loss for a first filter of the diplexer of FIG. 11 and the same filter in the multiplexer of FIG. 13.

FIG. 15A is a graph that compares insertion loss for the filter 112 of the diplexer 110 of FIG. 11 and the same filter 112 in the multiplexer 130 of FIG. 13. This graph indicates that the filter 90 provides no significant insertion loss degradation in the passband $B_B$ of the filter 112.

FIG. 15B is a graph that compares insertion loss for the filter 114 of the diplexer 110 of FIG. 11 and the same filter 114 in the multiplexer 130 of FIG. 13. This graph indicates that the filter 90 provides no significant insertion loss degradation in the passband $B_C$ of the filter 114.

Figure 16:
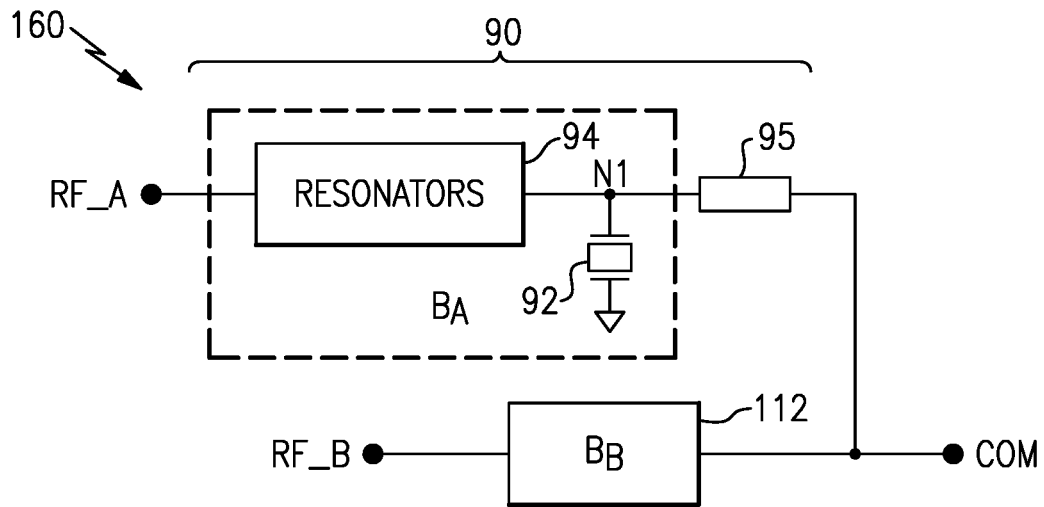
FIG. 16 is a schematic diagram of diplexer according to an embodiment.

FIG. 16 is a schematic diagram of diplexer 160 according to an embodiment. FIG. 16 illustrates that the filter 90 can be implemented in a diplexer 160 with one other filter 112 connected to the common node COM. As illustrated in FIG. 16, the filter 90 and the filter 112 have fixed connections to the common node COM. This can be referred to as hard multiplexing or fixed multiplexing. There is no intervening switch between the filter 90 and the common node COM as illustrated. Similarly, there is no switch between the filter 112 and the common node COM as illustrated. The filter 112 can have the topology illustrated in FIG. 3, for example. The filter 112 can have any other suitable topology.

Figure 17:
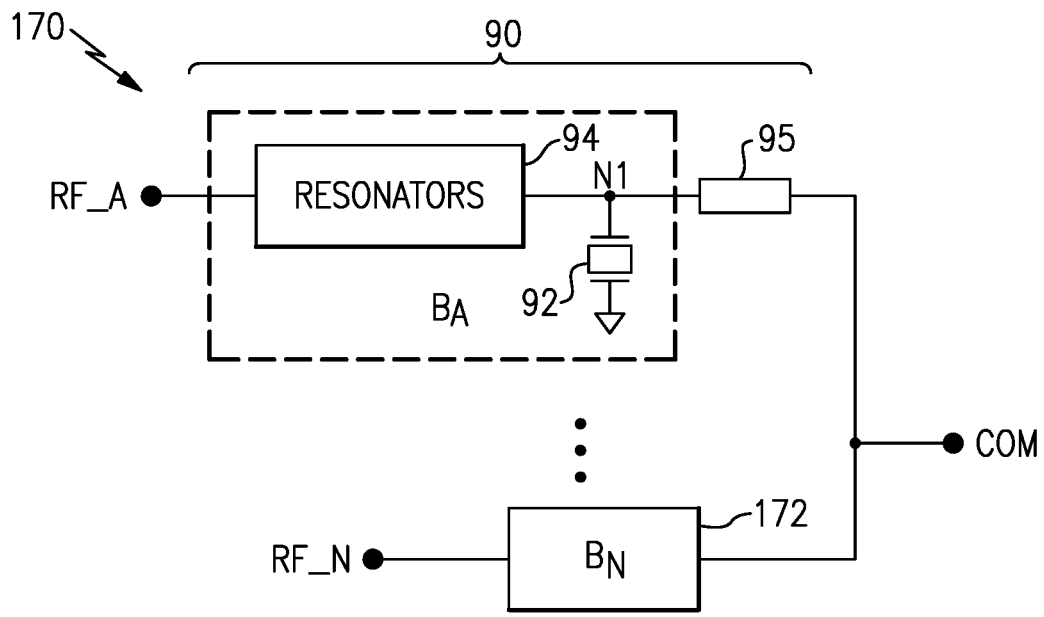
FIG. 17 is a schematic diagram of a multiplexer according to an embodiment.

FIG. 17 is a schematic diagram of a multiplexer 170 according to an embodiment. FIG. 17 illustrates that the filter 90 can be implemented in a multiplexer 170 with any suitable number of filters. The multiplexer 170 includes the filter 90 and a plurality of other filters including N-th filter 172. For example, the multiplexer can include 4, 6, 8, or any other suitable number of filters. The filter 90 can have the lowest passband of all filters of the multiplexer 170. As illustrated, the filters of the multiplexer 170 have fixed connections to the common node COM.

Figure 18:
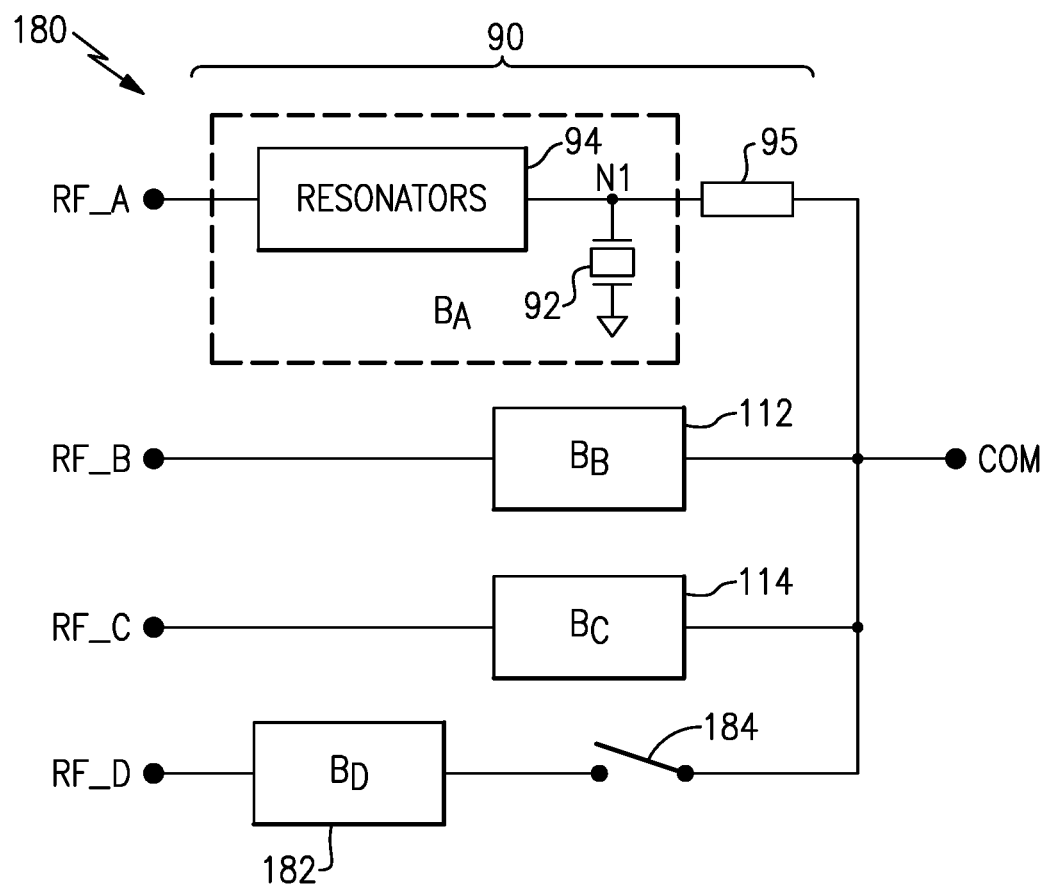
FIG. 18 is a schematic diagram of multiplexer according to another embodiment.

FIG. 18 is a schematic diagram of a multiplexer 180 according to another embodiment. FIG. 18 illustrates that the filter 90 can be implemented in a multiplexer 180 with at least one filter electrically connected to the common node COM via a respective switch. The multiplexer 180 includes a filter 182 electrically connected to the common node COM via switch 184. The multiplexer 180 includes three filters 90, 112, and 114 with fixed connections to the common node COM and one filter 182 connected to the common node COM via the switch 184. In certain applications, the filter 182 can have a passband that is above the respective passbands of each of the filters 90, 112, and 114. Accordingly, the multiplexer 180 can include the filter 182 with the highest passband electrically connected to the common node COM via the switch 184 and the filter 90 with the lowest passband that includes series inductor 95 and shunt resonator 92 arranged to increase gamma in the passbands of the filters 112 and 114.

Figure 19:
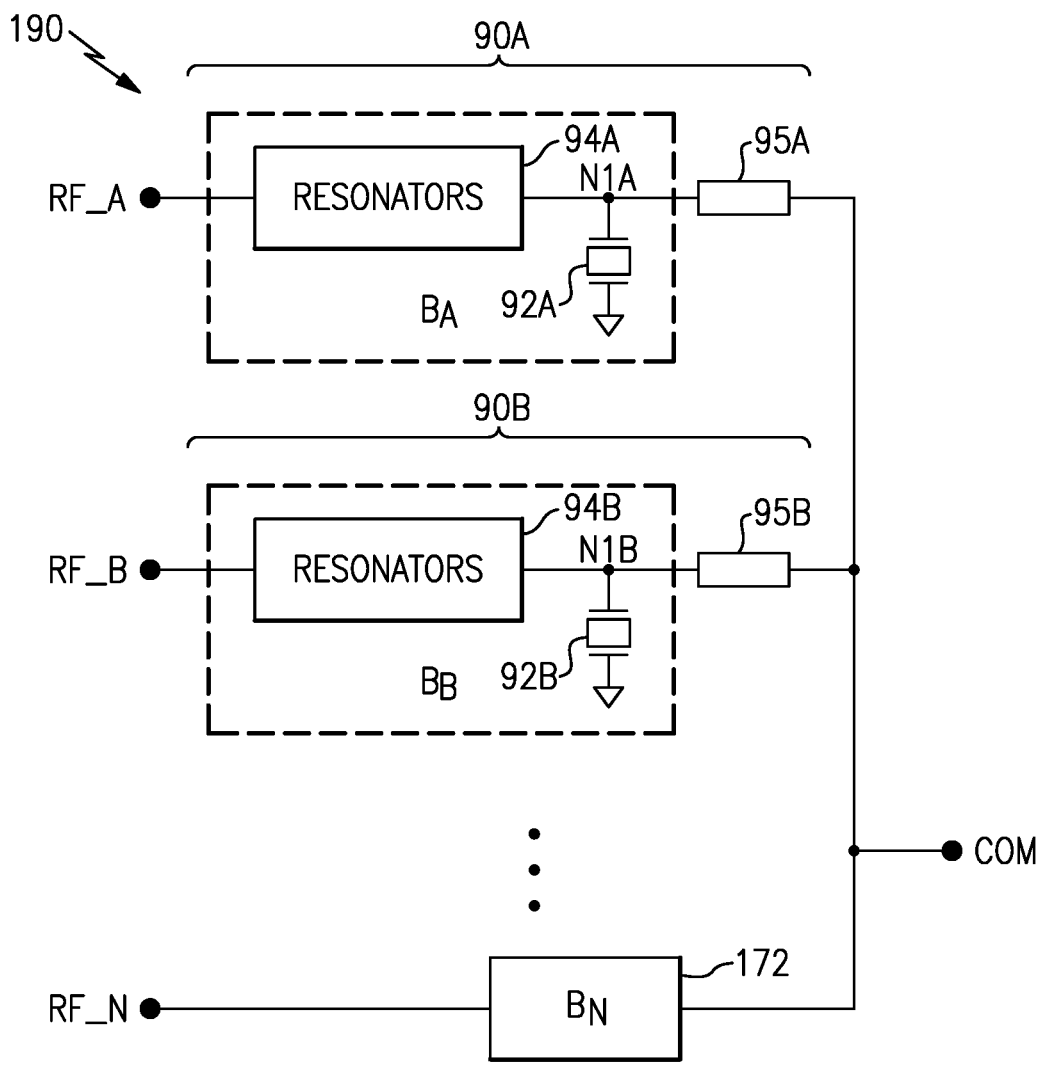
FIG. 19 is a schematic diagram of multiplexer according to another embodiment.

FIG. 19 is a schematic diagram of a multiplexer 190 according to another embodiment. The multiplexer 190 includes two filters 90A and 90B with topologies of the filter 90 of FIG. 9. The filter 90A includes a shunt acoustic resonator 92A, other acoustic resonators 94A, and a series inductor 95A coupled between the common node COM and both the shunt acoustic resonator 92A and the other acoustic resonators 94A. The shunt acoustic resonator 92A is coupled to a node N1A between all other acoustic resonators of the acoustic wave filter 90A and the common node COM. The filter 90B includes a shunt acoustic resonator 92B, other acoustic resonators 94B, and a series inductor 95B coupled between the common node COM and both the shunt acoustic resonator 92B and the other acoustic resonators 94B. The shunt acoustic resonator 92B is coupled to a node N1B between all other acoustic resonators of the acoustic wave filter 90B and the common node COM.

The filter 90B can have a higher passband and $B_B$ than the passband $B_A$ of the filter 90A. The passbands $B_A$ and $B_B$ of the filters 90A and 90B, respectively, can be relatively close to each other such that significant gamma degradation below passband $B_B$ of the filter 90B does not fall within the lower passband $B_A$ of filter 90A. The multiplexer 190 also includes N-th filter 172 that has a passband $B_N$ above the respective passbands $B_A$ and $B_B$ of the filters 90A and 90B. The multiplexer 190 can include any suitable number of filters. For example, the multiplexer 190 can include 6 or more filters in certain applications.

Figure 20:
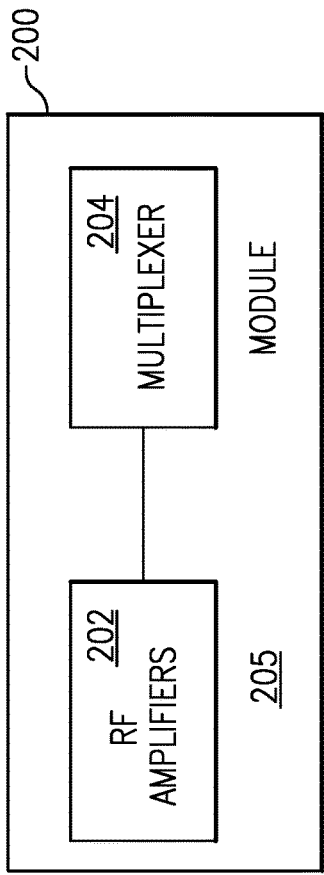
FIG. 20 is a schematic block diagram of a module that includes radio frequency amplifiers and a multiplexer according to an embodiment.
Figure 21:
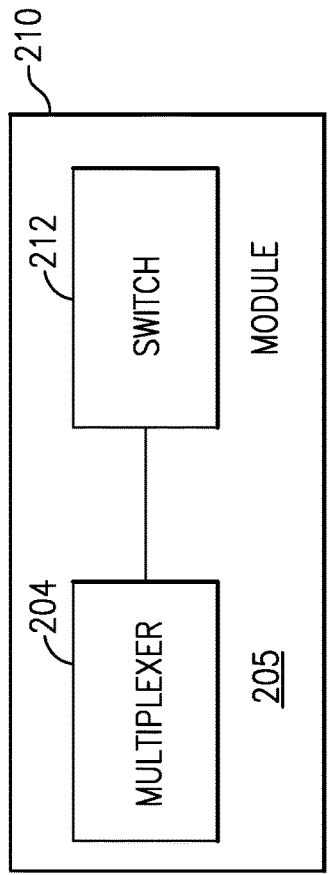
FIG. 21 is a schematic block diagram of a module that includes a multiplexer and a switch according to an embodiment.
Figure 22:
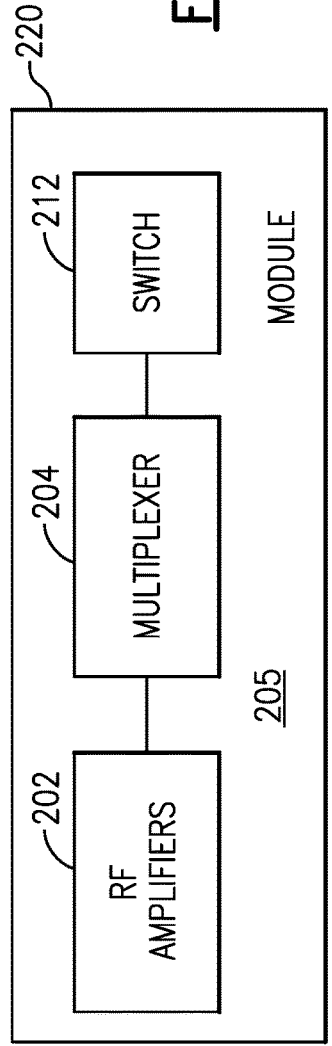
FIG. 22 is a schematic block diagram of a module that includes radio frequency amplifiers, a multiplexer, and a switch according to an embodiment.

Any suitable combination of features of the multiplexers disclosed herein can be implemented together with each other. The multiplexers disclosed herein can be implemented in a variety of packaged modules. Some example packaged modules will now be discussed in which any suitable principles and advantages of the multiplexers disclosed herein can be implemented. A module including two or more chips can be referred to as a multi-chip module. A module that includes a circuit element arranged to process a radio frequency signal can be referred to as a radio frequency module. The example packaged modules can include a package that encloses the illustrated circuit elements. The illustrated circuit elements can be disposed on a common packaging substrate. The packaging substrate can be a laminate substrate, for example. FIGS. 20, 21, and 22 are schematic block diagrams of illustrative packaged modules according to certain embodiments. Any suitable combination of features of these modules can be implemented with each other.

FIG. 20 is a schematic block diagram of a module 200 that includes radio frequency amplifiers 202 and a multiplexer 204 according to an embodiment. The radio frequency amplifiers 202 and the multiplexer 204 are enclosed within a common package in the module 210. The radio frequency amplifiers 202 can include one or more low noise amplifiers. Alternatively or additionally, the radio frequency amplifier 202 can include one or more power amplifiers. The radio frequency amplifiers 202 can amplify signals that are filtered and output by the multiplexer 204. For example, one or more low noise amplifiers of the radio frequency amplifiers 202 can amplify receive signals that are filtered by the multiplexer 204. Alternatively or additionally, one or more power amplifiers of the radio frequency amplifiers 202 can amplify transmit signals that are subsequently filtered by the multiplexer 204. The multiplexer 204 can be implemented in accordance with any suitable principles and advantages disclosed herein. For example, the multiplexer 204 can be any multiplexer disclosed herein.

FIG. 21 is a schematic block diagram of a module 210 that includes a multiplexer 204 and a switch 212 according to an embodiment. The multiplexer 204 and the switch 212 are enclosed within a common package in the module 210. The switch 212 can selectively electrically connect the multiplexer 204 to an antenna port of the module 210. The switch 212 can be a multi-throw radio frequency switch. In such instances, the switch 212 can electrically connect the multiplexer 204 or one or more other filters/multiplexers to the antenna port.

FIG. 22 is a schematic block diagram of a module 220 that includes radio frequency amplifiers 202, a multiplexer 204, and a switch 212 according to an embodiment. The radio frequency amplifiers 202, the multiplexer 204, and the switch 212 are enclosed within a common package in the module 220. The module 220 can include elements of the module 100 and elements of the module 210.

Figure 23:
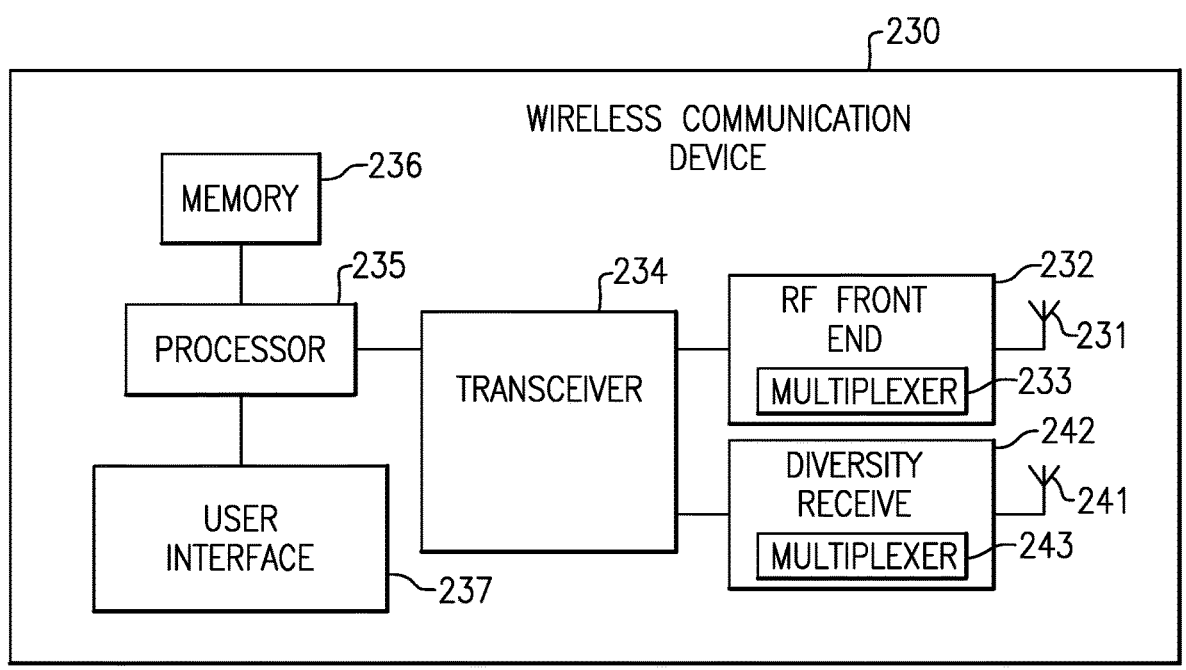
FIG. 23 is a schematic block diagram of a wireless communication device that includes a multiplexer according to an embodiment.

The multiplexers disclosed herein can be implemented in wireless communication devices. FIG. 23 is a schematic block diagram of a wireless communication device 230 that includes a multiplexer according to an embodiment. The wireless communication device 230 can be any suitable wireless communication device. For instance, a wireless communication device 230 can be a mobile phone, such as a smart phone. As illustrated, the wireless communication device 230 includes an antenna 231, a radio frequency (RF) front end 232 that includes a multiplexer 233, a transceiver 234, a processor 235, a memory 236, a user interface 237, a diversity antenna 241, and a diversity module 243 including a multiplexer 243. In some instances, the diversity module 243 can be considered part of a radio frequency front end.

The antenna 231 can transmit RF signals provided by the RF front end 232. Such RF signals can include carrier aggregation signals. The antenna 231 can receive RF signals and provide the received RF signals to the RF front end 232 for processing. Such RF signals can include carrier aggregation signals. The antenna 241 can received RF signals from the diversity antenna 241 and provide the received RF signals to the RF front end 232 for processing. Such RF signals can include carrier aggregation signals.

The RF front end 232 can include one or more power amplifiers, one or more low noise amplifiers, one or more RF switches, one or more multiplexers 233, one or more other filters, or any suitable combination thereof. The RF front end 232 can transmit and receive RF signals associated with any suitable communication standards. The multiplexer 233 can be implemented in accordance with any suitable principles and advantages disclosed herein.

The diversity module 242 can include more low noise amplifiers, one or more RF switches, one or more multiplexers 243, one or more other filters, or any suitable combination thereof. The multiplexer 243 can be implemented in accordance with any suitable principles and advantages disclosed herein. The diversity module 242 can perform any suitable diversity receive signal processing.

The RF transceiver 234 can provide RF signals to the RF front end 232 for amplification and/or other processing. The RF transceiver 234 can also process an RF signal provided by a low noise amplifier of the RF front end 232. The RF transceiver 234 can process an RF signal provided by a low noise amplifier of the diversity receive module 242. The RF transceiver 234 is in communication with the processor 235. The processor 235 can be a baseband processor. The processor 235 can provide any suitable base band processing functions for the wireless communication device 230. The memory 236 can be accessed by the processor 235. The memory 236 can store any suitable data for the wireless communication device 230. The processor 235 is also in communication with the user interface 237. The user interface 237 can be any suitable user interface, such as a display.

Multiplexers disclosed herein can include one or more filters arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can be implemented in accordance with any suitable principles and advantages disclosed herein. A multiplexer with a filter having increased gamma in a passband of one or more other filters of the multiplexer can be advantageous for meeting specifications related to 5G NR technology. As one example, such a multiplexer can be advantageous for 5G NR carrier aggregation applications.

Multiplexers disclosed herein can include one or more filters arranged to filter a radio frequency signal in a fourth generation (4G) Long Term Evolution (LTE) operating band. Multiplexers disclosed herein can include one or more filters having a passband that spans a 5G NR FR1 operating band and also a 4G LTE operating band.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer for filtering radio frequency signals, the multiplexer comprising:
   a first filter having a first passband that is a lowest passband of all filters of the multiplexer, the first filter including a series inductor and a plurality of acoustic resonators coupled to a common node by way of the series inductor, the plurality of acoustic resonators starting with a first shunt acoustic resonator from the common node, and each ladder stage of the first filter including a shunt acoustic resonator of the plurality of acoustic resonators, the first filter coupled to the common node without an intervening switch;
   a second filter coupled to the common node and having a second passband that is above the first passband, the series inductor and the first shunt acoustic resonator of the first filter together arranged to increase a reflection coefficient of the first filter in the second passband; and
   a third filter coupled to the common node via a switch, the first, second, and third filters being included in the multiplexer, the third filter having a third passband that is a highest passband of all filters of the multiplexer.

2. The multiplexer of claim 1 wherein series inductor and the first shunt acoustic resonator are together arranged to increase the reflection coefficient of the first filter in the third passband.

3. The multiplexer of claim 1 wherein the plurality of acoustic resonators includes a first ladder stage from the common node, and the first ladder stage starts with the first shunt acoustic resonator.

4. The multiplexer of claim 1 wherein all filters of the multiplexer are arranged as receive filters.

5. The multiplexer of claim 1 wherein the first filter is a transmit filter.

6. The multiplexer of claim 5 wherein the second filter is a second transmit filter.

7. The multiplexer of claim 1 wherein the second filter includes a front end series resonator and all other acoustic resonators of the second filter are coupled to the common node via the front end series resonator.

8. The multiplexer of claim 1 wherein the series inductor is a surface mount inductor.

9. The multiplexer of claim 1 wherein the plurality of acoustic resonators includes a surface acoustic wave resonator.

10. The multiplexer of claim 1 wherein the plurality of acoustic resonators includes a temperature compensated surface acoustic wave resonator.

11. The multiplexer of claim 1 wherein the plurality of acoustic resonators includes a bulk acoustic wave resonator.

12. A radio frequency module comprising:
    a multiplexer including a first filter having a first passband that is a lowest passband of all filters of the multiplexer, a second filter having a second passband, and a third filter having a third pass band that is a highest of all filters of the multiplexer, the first filter including a series inductor and a plurality of acoustic resonators coupled to a common node by way of the series inductor, the first filter coupled to the common node without an intervening switch and the third filter coupled to the common node via a switch, the plurality of acoustic resonators starting with a first shunt acoustic resonator from the common node, the series inductor and the first shunt acoustic resonator of the first filter together arranged to increase a reflection coefficient of the first filter in the second passband, and each ladder stage of the first filter including a shunt acoustic resonator of the plurality of acoustic resonators; and
    a radio frequency circuit element coupled to the multiplexer, the multiplexer and the radio frequency circuit element being enclosed within a common package.

13. The radio frequency module of claim 12 wherein the radio frequency circuit element is a radio frequency amplifier arranged to amplify a radio frequency signal.

14. The radio frequency module of claim 12 wherein the radio frequency circuit element is a switch configured to selectively couple the multiplexer to an antenna port of the radio frequency module.

15. The radio frequency module of claim 12 further comprising a multi-throw radio frequency switch.

16. The radio frequency module of claim 12 wherein the plurality of acoustic resonators includes a first ladder stage from the common node, and the first ladder stage starts with the first shunt acoustic resonator.

17. A wireless communication device comprising:
a multiplexer including a first filter having a first passband that is a lowest passband of all filters of the multiplexer, a second filter having a second passband, and a third filter having a third pass band that is a highest of all filters of the multiplexer, the first filter including a series inductor and a plurality of acoustic resonators coupled to a common node by way of the series inductor, the first filter coupled to the common node without an intervening switch and the third filter coupled to the common node via a switch, the plurality of acoustic resonators starting with a first shunt acoustic resonator from the common node, the series inductor and the first shunt acoustic resonator of the first filter together arranged to increase a reflection coefficient of the first filter in the second passband, and each ladder stage of the first filter including a shunt acoustic resonator of the plurality of acoustic resonators;
an antenna operatively coupled to the common node;
a radio frequency amplifier operatively coupled to the multiplexer and configured to amplify a radio frequency signal; and
a transceiver in communication with the radio frequency amplifier.

18. The wireless communication device of claim 17 wherein the plurality of acoustic resonators includes a first ladder stage from the common node, and the first ladder stage starts with the first shunt acoustic resonator.

* * * * *